United States Patent [19]
Park

[11] Patent Number: 5,524,092
[45] Date of Patent: Jun. 4, 1996

[54] MULTILAYERED FERROELECTRIC-SEMICONDUCTOR MEMORY-DEVICE

[76] Inventor: Jea K. Park, 25998 Reynolds St., Loma Linda, Calif. 92354

[21] Appl. No.: 391,239

[22] Filed: Feb. 17, 1995

[51] Int. Cl.$^6$ ................................................. G11C 11/22
[52] U.S. Cl. ............................................ 365/145; 257/295
[58] Field of Search .................................... 365/145, 149, 365/117; 257/295

[56]          References Cited

U.S. PATENT DOCUMENTS

| | | | |
|---|---|---|---|
| 3,728,694 | 4/1973 | Rohrer | 340/173.2 |
| 5,024,964 | 6/1991 | Rohrer et al. | 437/47 |
| 5,331,187 | 7/1994 | Ogawa | 365/145 X |
| 5,341,325 | 8/1994 | Nakano et al. | 365/145 |
| 5,375,082 | 12/1994 | Katti et al. | 365/145 X |
| 5,390,142 | 2/1995 | Gendlin | 365/145 |
| 5,416,042 | 5/1995 | Beach et al. | 365/145 X |

*Primary Examiner*—Do Hyun Yoo

[57]          ABSTRACT

Disclosed is a novel ferroelectric-semiconductor interface memory element for a dual-valued, capacitive memory diode of an integrated circuit which consists of a layer of metal electrode, a layer of diffusion barrier conductor, a layer of ferroelectric material, a layer of semiconductor crystal, and a layer of metal electrode. Also disclosed is an alternative, novel, ferroelectric-semiconductor interface memory element for a dual-valued, capacitive memory diode of an integrated circuit which consists of a layer of metal electrode, a layer of diffusion barrier conductor, a layer of ferroelectric material, another layer of diffusion barrier conductor, a layer of semiconductor crystal, and a layer of metal electrode. The two values of maximum capacitance in a single capacitor are achieved in these capacitive diodes by making use of accumulation, depletion, or inversion of semiconductor surface charges as a result of the orientation of the remnant polarization of ferroelectric in proximity.

15 Claims, 4 Drawing Sheets

MULTILAYERED FERROELECTRIC-SEMICONDUCTOR MEMORY-DEVICE

CROSS-REFERENCES TO RELATED APPLICATIONS

U.S. Patent Documents

| | | | |
|---|---|---|---|
| 3,728,694 | 4/1973 | George A. Rohrer | 340/173.2 |
| 5,024,964 | 6/1991 | Rohrer et al | 437/47 |
| 5,416,042 | 5/1995 | Beach et al | 365/145 |
| 5,390,142 | 2/1995 | Gendelin | 365/145 |
| 5,375,082 | 12/1994 | Katti et al | 365/145 |
| 5,341,325 | 8/1994 | Nakano et al | 365/145 |
| 5,331,187 | 7/1994 | Ogawa | 365/145 |

BACKGROUND—FIELD OF INVENTION

This invention relates to a ferroelectric-semiconductor memory-device, and specifically to such processes of manufacturing such structures.

BACKGROUND—DESCRIPTION OF PRIOR ART

Ferroelectric materials are dielectrics which can be used in computer memory circuits by making use of the polarization of the ferroelectric materials. As described in U.S. Pat. No. 3,728,694, for example, a capacitor can also be formed having a ferroelectric material between two electrodes to serve as the dielectric. Because of the hysteresis curve, when an applied voltage is removed, the polarization of ferroelectric material will be in one of two distinct polarized states. These states give the same value of capacitance. Therefore, the orientation of the polarization can not be determined by measuring the value of the capacitance only. The object of this invention is to provide a structure which will overcome the problem of determining the direction of the polarization of the ferroelectric by measuring capacitance of a memory device.

In reviewing the background art available in the field, the inventor herein noted several prior U.S. patents which disclosed memory structure which could be misinterpreted as being the same as the present invention to be described hereinafter.

Katti et al (U.S. Pat. No. 5,375,082)—This memory provides an analog memory by making use of a magnetically switchable ferromagnetic or ferrimagnetic layer which is sandwiched between an electrical conductor which provides the ability to magnetize the magnetically switchable layer and a magnetoresistive or Hall effect material which allows sensing the magnetic field which emanates from the magnetization of the magnetically switchable layer. This multilayered memory uses entirely different structure and properties from the ferroelectric-semiconductor structure and properties of the present inventor. This is because the ferroelectric properties are different from the ferromagnetic, or ferrimagnetic, or magnetoresistive properties.

Gendlin (U.S. Pat. No. 5,390,142)—This memory utilizes a composition of materials having ferromagnetic, piezoelectric, and electro-optical properties instead of ferroelectric-semiconductor proximity properties (polarization of ferroelectric and depletion of semiconductor surface) of the memory of the present inventor.

Nakano (U.S. Pat. No. 5,341,325)—This memory utilizes a large number of first conductive members, a ferroelectric film, and a large number of second conductive members. It is different from the memory structure of the present inventor, because the second conductive members are not a semiconductor substrate and it does not provide dual capacitance values due to a change of surface depletion of charge carriers of the semiconductor surface of the memory of the present inventor.

Ogawa (U.S. Pat. No. 5,331,187)—This memory utilizes a ferroelectric thin film on a MgO single crystal substrate which does not exhibit semiconducting properties and this memory does not utilize a surface depletion capacitance of a semiconductor in proximity of a ferroelectric layer of the memory of the present inventor.

Beach et al (U.S. Pat. No. 5,416,042)—This memory structure utilizes a MIM structure having a three-layer structure consisting of a metal layer(M), an insulating layer(I), and a metal layer(M) and this memory is different from the memory of the present inventor, because it does not utilize a semiconductor-ferroelectric proximity properties.

SUMMARY OF THE INVENTION

The present invention is very novel, and unique in its structure, wherein it involves two electrodes and ferroelectric-semiconductor interface. This invention is also a novel, compact, dual-valued, capacitive memory diode, which is structured as a metal/ferroelectric/semiconductor/metal diode. In order to have two different values of the capacitance depending on the direction of the polarization of the ferroelectric layer, the ferroelectric-semiconductor interface properties are used in achieving two states of capacitance values. This ferroelectric-semiconductor capacitive memory diode includes two electrodes deposited on opposite surfaces of the ferroelectric-semiconductor dual layers. This invention also provides a process sequences of manufacturing a ferroelectric-semiconductor capacitive memory diodes including the sequences of forming the first metal conductor layer over a layer of barrier metal conductor, forming the barrier conductor layer over a ferroelectric layer, forming the ferroelectric layer over a semiconductor crystal layer, and forming a metal ohmic contact to the semiconductor layer. By forming these multilayered structures, these new devices have achieved higher switching performance than simple previous memories, semi-infinite switching cycles of electrical switching characteristics(greater than 10 billion cycles), and higher device density per silicon real estate as a result of the high dielectric constant. All of these multilayers are easy to process in an integrated circuit manufacturing foundry with only several steps modification of process sequences. It is object of this invention to provide a unique diode capacitive memory element that meet the before mentioned requirements of memory characteristics as an integrated circuit capacitive memory diode. While prior arts can provide only one value of capacitance ion their fully polarized states regardless of their directions of polarization, the present invention can give two values of capacitance in one device, depending on the direction of the polarization of ferroelectric layer. These polarized states can be determined by determining the value of the capacitance of the diode without changing the states of the polarization, thereby nondestructively reading the stored information.

BRIEF DESCRIPTION OF THE DRAWINGS

In describing the preferred embodiments, references are made to the accompanying drawings wherein.

Reference Numerals In Drawings

| | |
|---|---|
| 1 Metal Conductor | 2 Diffusion Barrier |
| 3 Ferroelectric Film | 4 Semiconductor Crystal |
| 5 Metal Conductor | |
| 11 Metal Conductor | 12 Diffusion Barrier |
| 13 Ferroelectric Film | 14 Diffusion Barrier |
| 15 Semiconductor Crystal | 16 Metal Conductor |

P1,P2,P3,P4,P5,P6,P7,P8,P9,P10,P11 Points on the hysteresis curve
Pa,Pb,Pc,Pd,Pe,Pf Points on the capacitance hysteresis curve
Pr Remnant polarization

DETAILED DESCRIPTION OF THE PREFERRED EMBODIMENTS

Figure 3:
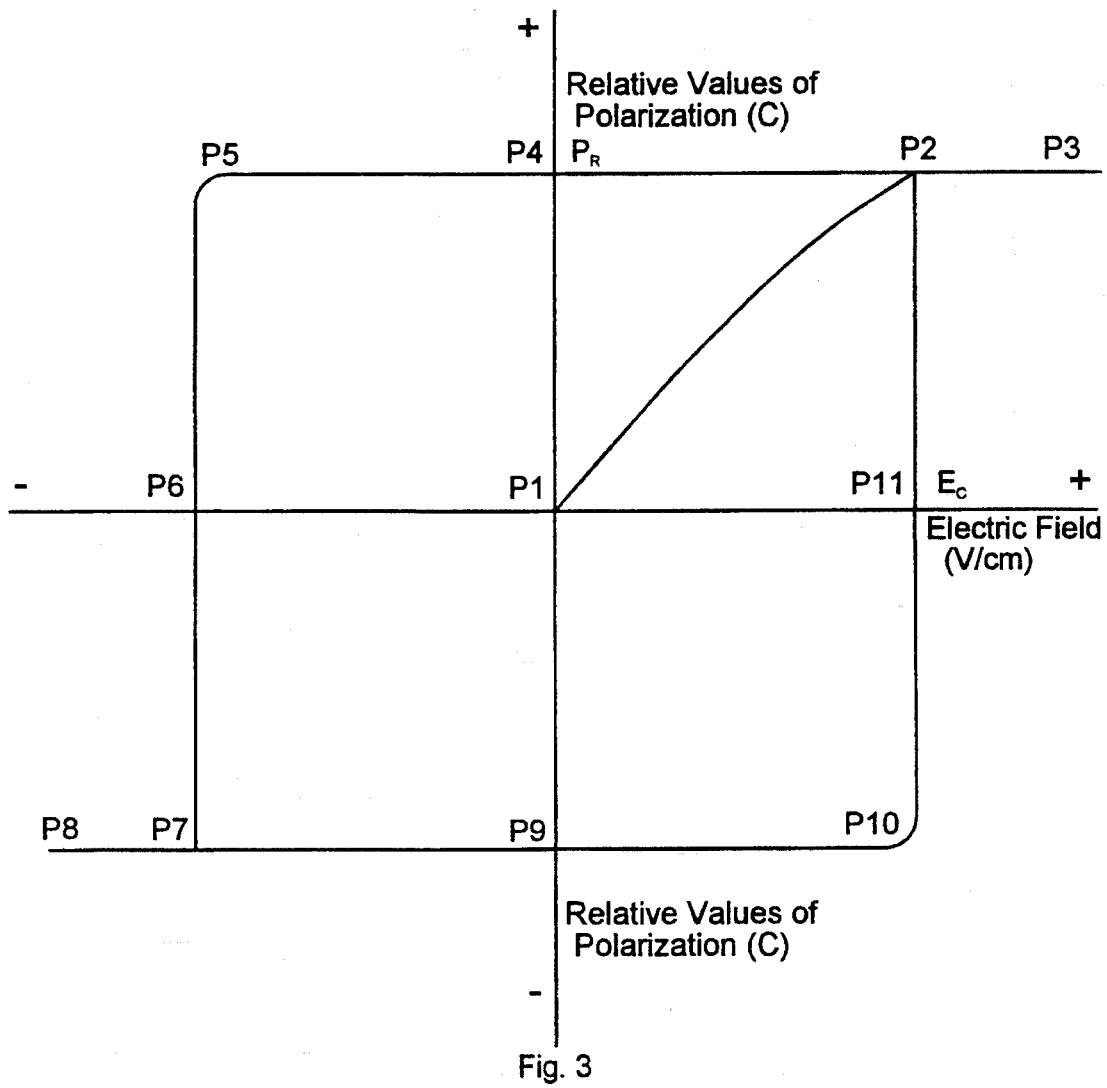
FIG. 3 illustrates a hysteresis loop showing a plot of polarization versus electric field.
Figure 4:
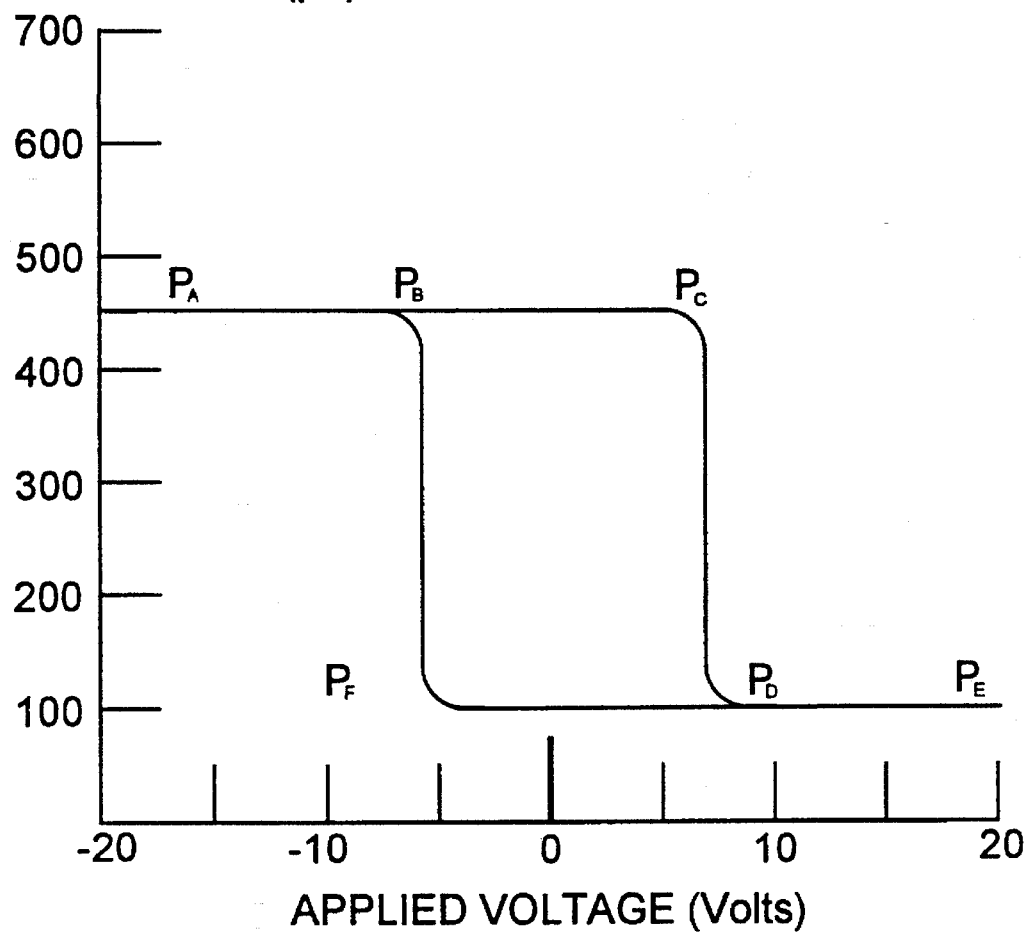
FIG. 4 is a sketch of a capacitance hysteresis loop exhibited by a ferroelectric-semiconductor structure of the present invention to show two states of the capacitance of a diode at zero-bias.

A ferroelectric material exhibits a net electric dipole moment, when the material is spontaneously polarized. Experimentally, this spontaneous polarization, as shown at point P4 in FIG. 3, can be measured from a typical plot of polarization versus electric field for a single layer of ferroelectric. This is an electric hysteresis loop. The spontaneous polarization or remnant polarization can be determined by measuring the polarization at zero electric field as shown in FIG. 3 for a single layer of the ferroelectric. When the ferroelectric layer is freshly deposited, there is no net polarization present in the ferroelectric material without applied electric field as shown at point P1 in FIG. 3. In the freshly deposited film, polarizations are randomly oriented. When we increase the applied voltage across the ferroelectric layer with two electrode contacts on opposite sides, thereby increasing the electric field in one direction, the directional polarization increase in the same direction until it reaches maximum value by realigning the polarization in the same direction of the applied, positive, electric field. This maximum value of polarization is achieved by applying an external electric field which is larger than the critical value, called, coercive field, $E_c$, as shown at point P11 in FIG. 3. In the ferroelectric-semiconductor (N-type) structure of the present invention, if the positive external field, which is applied with two electrode contacts on opposite sides, is larger than the coercive field, the polarization in the ferroelectric layer will be aligned with applied electric field as before, and there will be remnant polarization, even after the external field is removed. The remnant polarization will attract negative compensation charges toward the interface creating an accumulation layer on the interface of the N-type semiconductor. Under this condition, the measured capacitance is that of the ferroelectric layer. However, when a negative external field, with a value of which is larger than the coercive field across the ferroelectric layer, is applied across the ferroelectric-semiconductor structure, the remnant polarization in the ferroelectric layer will repel the negative compensation charges from the interface of semiconductor creating an depletion layer on the surface of the N-type semiconductor. Under this condition, the measured capacitance across the ferroelectric-semiconductor layer is a series sum of the ferroelectric layer capacitance and the semiconductor depletion layer capacitance, as shown in the FIG. 4. In the ferroelectric-semiconductor(P-type) structure of the present invention, the remnant polarization in the ferroelectric layer repel or attract positive charges instead of negative charges as in the case of the ferroelectric-semiconductor(N-type) structure.

Figure 1:
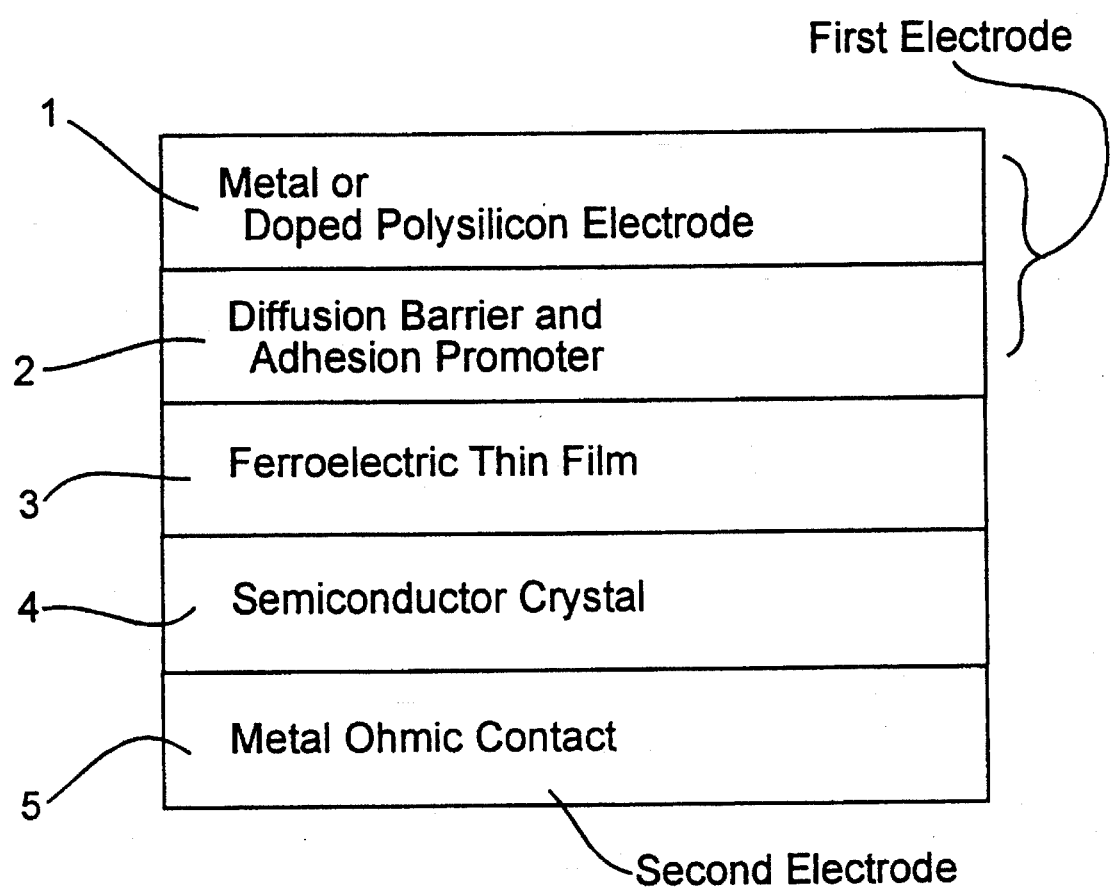
FIG. 1 illustrates a cross-sectional view of the first embodiment of the ferroelectric-semiconductor capacitive memory diode of the present invention.

FIG. 1 illustrate the use of ferroelectric layer-semiconductor crystal layer in one of the metal/ferroelectric/semiconductor/metal capacitive memory diode according to the first embodiment of the present invention. A layer of interconnection electrode metal 1 comprises the first layer of the structure. Either heavily doped polysilicon layer or high conductivity metal, which is compatible with integrated circuit manufacturing process such as aluminum(Al), gold(Au), platinum(Pt), or others, can be used in this layer. The first layer 1 has a thickness from about 1000 Å to 10,000 Å depending upon a required conductance value. This layer 1 of metal can be established by a method of vacuum evaporation or radio-frequency sputtering. A layer 2 of conducting refractory metal, such as titanium(Ti), tungsten(W), or conducting oxide such as ITO(indium tin oxide), or conducting silicon-nitride with a thickness not exceeding 1000 Å in order to have a proximity effect, is established below the first layer of metal 1. This layer 2 of conductor can be established by a method of radio-frequency sputtering and serves as an atomic diffusion barrier and adhesion promoter between ferroelectric layer 3 and metal layer 1. A layer of ferroelectric film 3, such as barium titanate(BaTiO$_3$), lead zirconate titanate(PZT), lanthanium doped lead zirconate titanate(PLZT), or other spontaneously polarizable ferroelectric material, with a thickness not exceeding 10,000 Å for a planar device application is established under the conducting layer 2 and serves as remnant polarization, which will change electrical characteristics of the semiconductor surface by accumulation, depletion, or inversion of the surface charge carriers; electrons, or holes of the semiconductor layer 4 under the ferroelectric layer 3. This ferroelectric materials are deposited by a method of chemical vapor deposition, radio-frequency sputtering, or molecular beam epitaxy. A layer of semiconductor crystal 4 with a thickness exceeding 1000 Å in order to have practical capacitance values, such as silicon substrate or epitaxial silicon, is formed below the ferroelectric layer 3. The other layer of metal interconnector electrode 5 is established on the semiconductor 4. This metal layer 5 is formed on the semiconductor layer through the ohmic contact method.

Figure 2:
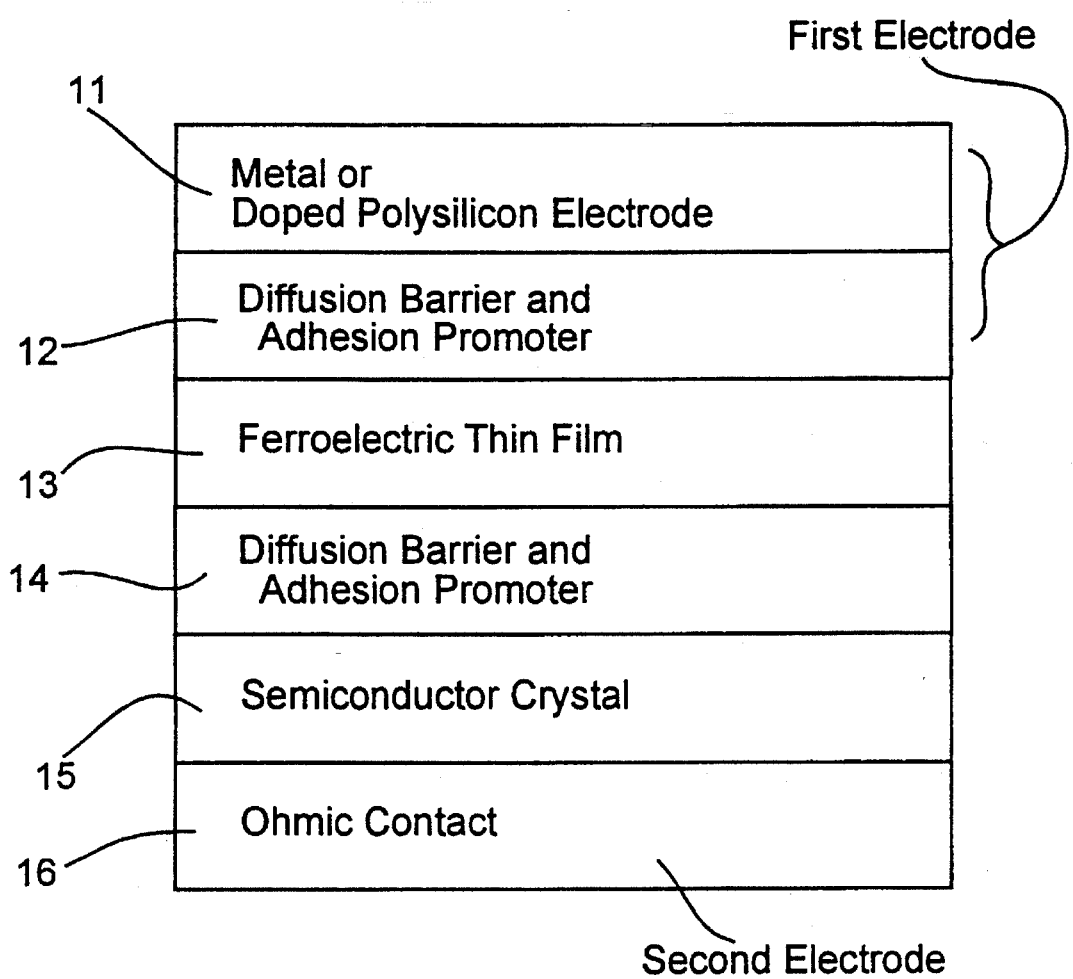
FIG. 2 illustrates a cross-sectional view of the second embodiment of the ferroelectric-semiconductor capacitive memory diode of the present invention.

FIG. 2 illustrate the use of ferroelectric layer-semiconductor crystal layer in one of the metal/ferroelectric/semiconductor/metal capacitive memory diode according to the second embodiment of the present invention. A layer of interconnection electrode metal 11 comprises the first layer of the structure. Either heavily doped polysilicon layer or high conductivity metal, which is compatible with integrated circuit manufacturing process such as aluminum(Al), gold(Au), platinum(Pt), or others, can be used in this layer. The first layer 11 has a thickness from about 1000 Å to 10,000 Å depending upon a required conductance value. This layer 11 of metal can be established by a method of vacuum evaporation or radio-frequency sputtering. A layer 12 of conducting refractory metal, such as titanium(Ti), tungsten(W), or conducting oxide such as ITO(indium tin oxide), or conducting silicon-nitride with a thickness not exceeding 1000 Å in order to have a proximity effect, is established below the first layer of metal 11. This layer 12 of conductor can be established by a method of radio-frequency sputtering and serves as an atomic diffusion barrier and adhesion promoter between ferroelectric layer 13 and metal layer 11. A layer of ferroelectric film 13, such as barium titanate(BaTiO$_3$), lead zirconate titanate(PZT), lanthanium doped lead zirconate titanate(PLZT), or other spontaneously polarizable ferroelectric material with a thickness not exceeding 10,000 Å for a planar device application, is established under the conducting layer 12 and serves as remnant polarization, which will change electrical characteristics of the semiconductor surface by accumulation, depletion, or inversion of the surface charge carriers; electrons, or holes of the semiconductor layer 15 under the barrier conductor layer 14. This ferroelectric materials are deposited by a method of chemical vapor deposition, radio-frequency sputtering, or molecular beam epitaxy. A layer 14 of barrier conductor and adhesion promoter, such as refractory metal or conducting oxide such as indium-tin-oxide, or conducting nitride with a thickness not exceeding 1000 Å in order to have a proximity effect is formed below the ferroelectric layer 13. A crystal layer 125 of silicon semiconductor or semiconductor substrate with a thickness exceeding 10,000 Å in order to be a substrate is formed below the barrier conductor layer 14. The other layer of metal interconnector electrode 16 is established on the semiconductor layer 15. This metal layer 16 is established on the semiconductor layer through the ohmic contact method.

Summary, Ramifications, and Scope

While the present invention has been particularly shown and described with reference to preferred embodiments, it will be understood by those skilled in the art that changes, and modifications in form and details may be made without departing from the spirit and scope of the present invention.

Thus the scope of the invention should be determined by the appended claims and their legal equivalents, rather than by the examples given.

I claim:

1. A multilayered ferroelectric-semiconductor and dual-valued capacitive memory-device comprising:

a first layer comprising a metal or a heavily doped polysilicon electrode layer;

a second layer comprising a diffusion barrier conductor and an adhesion promoter out of refractory metal or conducting oxide;

a third layer comprising a ferroelectric thin film;

a fourth layer comprising a semiconductor crystal layer or a semiconductor crystal substrate;

a fifth layer comprising a metal electrode;

wherein said first layer is in direct contact with said second layer, said second lawyer is in direct contact with said third layer, said third layer is in direct contact with said fourth layer, and said fourth layer is in direct contact with said fifth layer, and wherein said first layer to said fifth layer are arranged in the order from a top layer to a bottom layer.

2. A device of claim 1, wherein a first electrode of the multilayered ferroelectric-semiconductor and dual-valued capacitive memory-device comprises a combination of said first layer and said second layer.

3. A device of claim 1, wherein said first layer of the multilayered ferroelectric-semiconductor and dual-valued capacitive memory-device comprises a conductor from a high conductivity metal, such as aluminum(Al), gold(Au) or platinum(Pt), or a heavily doped polysilicon electrode layer with a thickness from about 1000 Å to 10,000 Å depending upon a required conductance value.

4. A device of claim 1, wherein said second layer of the multilayered ferroelectric-semiconductor and dual-valued capacitive memory-device comprises the diffusion barrier conductor and the adhesion promoter in one layer from the refractory metal, the conducting oxide, or a conducting silicon-nitride with a thickness not exceeding 1000 Å in order to have a proximity effect.

5. A device of claim 1, wherein said third layer of the multilayered ferroelectric-semiconductor and dual-valued capacitive memory-device comprises a spontaneously polarizable ferroelectric material for the ferroelectric thin film from barium titanate(BaTiO$_3$), lead zirconate titanate(PZT), or lanthanium doped lead zirconate titanate(PLXT) with a thickness not exceeding 10,000 Å for a planar device application.

6. A device of claim 1, wherein said fourth layer of the multilayered ferroelectric-semi-conductor and dual-valued capacitive memory-device comprises the semiconductor crystal layer with a thickness exceeding 1000 Å in order to have practical capacitance values.

7. A device of claim 2, wherein said fifth layer of the multilayered ferroelectric-semiconductor and dual-valued capacitive memory-device, which is also a second electrode, comprises a metal to semiconductor ohmic contact as the metal electrode to said fourth layer of the semiconductor crystal substrate.

8. A multilayered ferroelectric-semiconductor and dual-valued capacitive memory-device comprising:

a first layer comprising a metal or a heavily doped polysilicon electrode layers a second layer comprising a diffusion barrier conductor and an adhesion promoter out of refractory metal or conducting oxide;

a third layer comprising a ferroelectric than film;

a fourth layer comprising a diffusion barrier conductor and an adhesion promoter out of refractory metal, or conducting oxide such as indium-tin-oxide;

a fifth layer comprising a semiconductor crystal layer, or a semiconductor crystal substrate;

a sixth layer comprising a metal electrode;

wherein said first layer is in direct contact with said second layer, said second layer is in direct contact with said third layer, said third layer is in direct contact with said fourth layer, said fourth layer is in direct contact with said fifth layer, and said fifth layer is in direct contact with said sixth layer, and wherein said first layer to said sixth layer are arranged in the order from a top layer to a bottom layer.

9. A device of claim 8, wherein a first electrode of the multilayered ferroelectric-semiconductor and dual-valued capacitive memory-device comprises a combination of said first layer and said second layer.

10. A device of claim 8, wherein said first layer of the multilayered ferroelectric-semiconductor and dual-valued capacitive memory-device comprises a conductor from a high conductivity metal, such as aluminum(Al), gold(Au) or platinum(Pt), or a heavily doped polysilicon electrode layer with a thickness from about 1000 Å to 10,000 Å depending upon a required conductance value.

11. A device of claim 8, wherein said second layer of the multilayered ferroelectric-semiconductor and dual-valued capacitive memory-device comprises the diffusion barrier conductor and the adhesion promoter in one layer from the refractory metal, the conducting oxide, or a conducting silicon-nitride with a thickness not exceeding 1000 Å in order to have a proximity effect.

12. A device of claim 8, wherein said third layer of the multilayered ferroelectric-semiconductor and dual-valued capacitive memory-device comprises a spontaneously polarizable ferroelectric material for the ferroelectric thin film from barium titanate($BaTiO_3$), lead zirconate titanate(PZT), or lanthanium doped lead zirconate titanate(PLZT) with a thickness not exceeding 10,000 Å for a planar device application.

13. A device of claim 8, wherein said fourth layer of the multilayered ferroelectric-semiconductor and dual-valued capacitive memory-device comprises the diffusion barrier conductor and the adhesion promoter in one layer from, the refractory metal, the conducting oxide, or a conducting nitride with a thickness not exceeding 1000 Å in order to have a proximity effect.

14. A device of claim 8, wherein said fifth layer of the multilayered ferroelectric-semiconductor and dual-valued capacitive memory-device comprises the semiconductor crystal layer with a thickness exceeding 10,000 Å in order to be a substrate.

15. A device of claim 9, wherein said sixth layer of the multilayered ferroelectric-semiconductor and dual-valued capacitive memory-device, which is also second electrode, comprises a metal to semiconductor ohmic contact as the metal electrode to said fifth layer of the semiconductor crystal substrate.

* * * * *